(12) United States Patent
Christophy et al.

(10) Patent No.: US 10,705,358 B2
(45) Date of Patent: Jul. 7, 2020

(54) DISPLAY APPARATUS WITH ADJUSTABLE ANGLES-OF-VIEW COMPRISING BACKLIGHT STRUCTURES HAVING AN ELECTRICALLY ADJUSTABLE LENS ARRAY THAT ADJUSTS BACKLIGHT ILLUMINATION

(71) Applicant: Apple Inc., Cupertino, CA (US)

(72) Inventors: Miguel C. Christophy, San Francisco, CA (US); Ming Xu, Sunnyvale, CA (US)

(73) Assignee: Apple, Inc., Cupertino, CA (US)

( * ) Notice: Subject to any disclaimer, the term of this patent is extended or adjusted under 35 U.S.C. 154(b) by 537 days.

(21) Appl. No.: 15/199,620

(22) Filed: Jun. 30, 2016

(65) Prior Publication Data

US 2017/0219859 A1  Aug. 3, 2017

Related U.S. Application Data

(60) Provisional application No. 62/290,081, filed on Feb. 2, 2016.

(51) Int. Cl.
*G02F 1/13* (2006.01)
*G02F 1/29* (2006.01)
(Continued)

(52) U.S. Cl.
CPC .......... *G02F 1/1323* (2013.01); *G02B 6/005* (2013.01); *G02F 1/1336* (2013.01); *G02F 1/29* (2013.01);
(Continued)

(58) Field of Classification Search
CPC ............. G02F 1/1323; G02F 2001/294; H01L 27/3232
See application file for complete search history.

(56) References Cited

U.S. PATENT DOCUMENTS 6,765,550 B2  7/2004  Janick et al.
8,357,312 B2  1/2013  Sun
(Continued)

FOREIGN PATENT DOCUMENTS

CN   101055361 A  * 10/2007  ....... G02F 1/134363
JP   2001056474 A  *  2/2001  ....... G02F 1/134363
(Continued)

OTHER PUBLICATIONS

Choi et al., U.S. Appl. No. 15/051,047, filed Feb. 23, 2016.
Choi et al., U.S. Appl. No. 15/064,097, filed Mar. 8, 2016.
Huang et al., U.S. Appl. No. 14/878,944, filed Oct. 8, 2015.

*Primary Examiner* — Paul C Lee
(74) *Attorney, Agent, or Firm* — Treyz Law Group, P.C.; G. Victor Treyz; Matthew R. Williams

(57) ABSTRACT

A display may have a backlight unit that provides backlight illumination. The backlight unit may include a light guide that distributes light throughout the display and an electrically adjustable lens array. The lens array may have lenses such as liquid lenses or liquid crystal lenses. By adjusting the lenses in the lens array, the angles of rays of backlight from the backlight unit may be adjusted to adjust the angle-of-view of the display. The angle-of-view of the display may also be adjusted using an electrically controllable filter layer. The electrically controllable filter layer may have a liquid crystal layer or a polymer dispersed liquid crystal layer that can be controlled using electrodes. When the electrodes apply signals to the electrically controllable filter layer, portions of the filter layer change to a dark or translucent state and restrict the angle-of-view of the display.

20 Claims, 10 Drawing Sheets

(51) Int. Cl.
*F21V 8/00* (2006.01)
*G02F 1/13357* (2006.01)
*G02F 1/1334* (2006.01)

(52) U.S. Cl.
CPC ............. *G02F 1/1334* (2013.01); *G02F 2001/133626* (2013.01); *G02F 2001/294* (2013.01)

(56) References Cited

U.S. PATENT DOCUMENTS

| | | | |
|---|---|---|---|
| 2005/0139837 A1* | 6/2005 | Lee | G02F 1/134363 257/72 |
| 2005/0259217 A1 | 11/2005 | Lin et al. | |
| 2006/0103782 A1* | 5/2006 | Adachi | G02F 1/1323 349/96 |
| 2009/0244466 A1* | 10/2009 | Tojo | G02F 1/134363 349/139 |
| 2011/0090413 A1* | 4/2011 | Liou | G02B 27/2214 349/15 |
| 2011/0255175 A1* | 10/2011 | Okita | G02B 3/14 359/665 |
| 2012/0099205 A1* | 4/2012 | Bae | G02B 3/0056 359/620 |
| 2013/0141937 A1* | 6/2013 | Katsuta | G02B 6/005 362/606 |
| 2014/0071393 A1* | 3/2014 | Chen | G02F 1/29 349/191 |
| 2014/0226093 A1 | 8/2014 | Schwartz et al. | |
| 2015/0029437 A1* | 1/2015 | Sakai | G02F 1/133634 349/61 |
| 2015/0156383 A1* | 6/2015 | Biemer | H04N 5/2259 348/148 |

FOREIGN PATENT DOCUMENTS

| | | | | |
|---|---|---|---|---|
| JP | 2001056475 A | * | 2/2001 | ....... G02F 1/134363 |
| JP | 2002229069 A | * | 8/2002 | ....... G02F 1/134363 |
| JP | 2008111973 A | * | 5/2008 | ....... G02F 1/133555 |
| JP | 2010060857 A | * | 3/2010 | ....... G02F 1/134363 |
| JP | 2011028067 A | * | 2/2011 | ....... C09K 19/0258 |
| WO | 2005071449 | | 8/2005 | |

* cited by examiner

DISPLAY APPARATUS WITH ADJUSTABLE ANGLES-OF-VIEW COMPRISING BACKLIGHT STRUCTURES HAVING AN ELECTRICALLY ADJUSTABLE LENS ARRAY THAT ADJUSTS BACKLIGHT ILLUMINATION

This application claims the benefit of provisional patent application No. 62/290,081 filed on Feb. 2, 2016, which is hereby incorporated by reference herein in its entirety.

FIELD

This relates generally to electronic devices and, more particularly, to electronic devices with displays.

BACKGROUND

Electronic devices often include displays. For example, laptop computers have displays. Displays are typically designed to display images over a relatively wide angle of view to accommodate movements in the position of a viewer relative to the display. In some situations, such as when a user of a laptop or other device with a display is using the device in public, the wide viewing angle is undesirable as it compromises privacy.

SUMMARY

A display may have a backlight unit that provides backlight illumination. The display may have display layers that form an array of pixels. The backlight unit may supply the backlight unit to the display layers.

The display layers may include substrate layers, a layer of liquid crystal material sandwiched between the substrate layers, and upper and lower polarizer layers. The substrate layers may include a color filter layer and a thin-film transistor layer and may be interposed between the upper and lower polarizers.

The backlight unit may include a light guide layer that distributes light from a light source and may include an electrically adjustable lens array through which backlight illumination passes that has scattered out of the light guide layer.

The lens array may have lenses such as liquid lenses or liquid crystal lenses. By adjusting the lenses in the lens array, the angles of rays of backlight illumination from the backlight unit may be adjusted to adjust the angle-of-view of the display.

The angle-of-view of the display may also be adjusted using an electrically controllable filter layer. The electrically controllable filter layer may have a liquid crystal layer or a polymer dispersed liquid crystal layer that can be controlled using electrodes. When the electrodes apply signals to the electrically controllable filter layer, portions of the filter layer change to a dark or translucent state and restrict the angle-of-view of the display. The electrically controllable lens array of the backlight structures can be used in conjunction with the electrically controllable filter layer.

DETAILED DESCRIPTION

Figure 1:
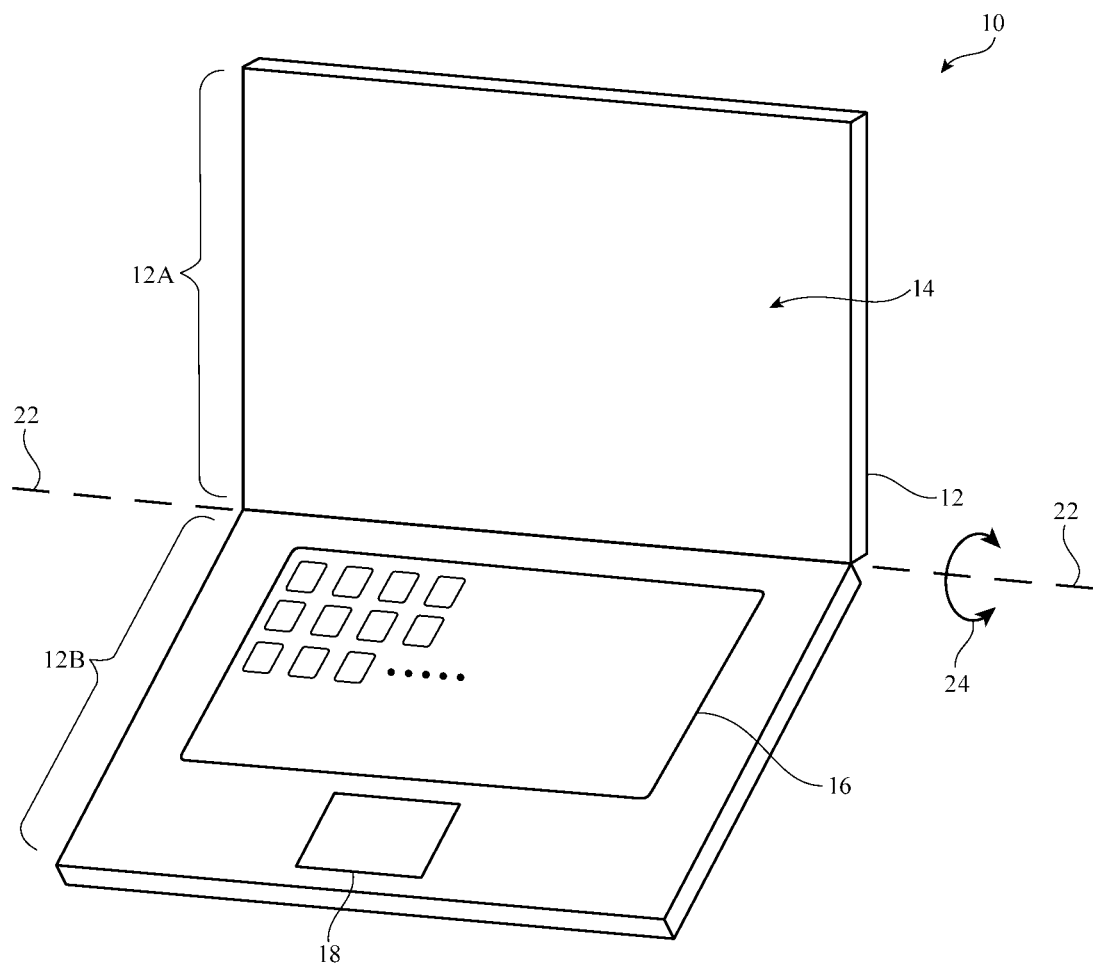
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a laptop computer. Other configurations may be used for device 10 if desired. The example of FIG. 1 is merely illustrative.

As shown in FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Housings 12A and 12B may be connected to each other using hinge structures located along the upper edge of lower housing 12B and the lower edge of upper housing 12A. Hinges may allow upper housing 12A to rotate about axis 22 in directions 24 relative to lower housing 12B.

Display 14 may be mounted in upper housing 12A. Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of electrowetting pixels, an array of organic light-emitting diode pixels, or pixels based on other display technologies. Configurations in which display 14 is a liquid crystal display with a backlight are sometimes described herein as an example. This use of liquid crystal display technology for forming display 14 is merely illustrative. Display 14 may, in general, be formed using any suitable type of pixels (e.g., display 14 may be an organic light-emitting diode display).

As shown in FIG. 1, device 10 may have input-output devices such as track pad 18 and keyboard 16. Device 10 may also have components such as cameras, microphones, speakers, buttons, status indicator lights, buzzers, sensors, and other input-output devices. These devices may be used to gather input for device 10 and may be used to supply a user of device 10 with output. Connector ports in device 10 may receive mating connectors (e.g., an audio plug, a connector associated with a data cable such as a Universal Serial Bus cable, a data cable that handles video and audio data such as a cable that connects device 10 to a computer display, television, or other monitor, etc.).

Figure 2:
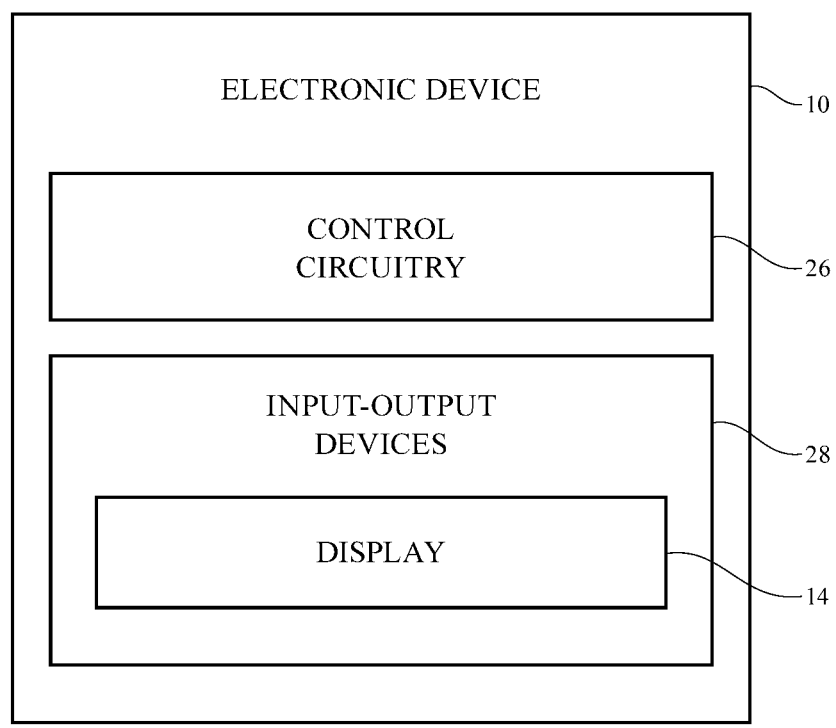
FIG. 2 is a schematic diagram of an illustrative electronic device having a display in accordance with an embodiment.

FIG. 2 is a schematic diagram of device 10. As shown in FIG. 2, electronic device 10 may have control circuitry 26. Control circuitry 26 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 26 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 28 may be used to allow data to be supplied to device 10 and to allow data to be provided from device 10 to external devices. Input-output devices 28 may include buttons, joysticks, scrolling wheels, touch pads, key pads, keyboards, microphones, speakers, tone generators, vibrators, cameras, sensors (e.g., ambient light sensors, proximity sensors, orientation sensors, magnetic sensors, force sensors, touch sensors, etc.), light-emitting diodes and other status indicators, data ports, etc. A user can control the operation of device 10 by supplying commands through input-output devices 28 and may receive status information and other output from device 10 using the output resources of input-output devices 28. Input-output devices 18 may include one or more displays such as display 14.

Control circuitry 26 may be used to run software on device 10 such as operating system code and applications. During operation of device 10, the software running on control circuitry 26 may display images on display 14 using an array of pixels in display 14. While displaying images, control circuitry 26 may control the transmission of each of the pixels in the array and can make adjustments to the amount of backlight illumination for the array that is being produced by backlight structures in display 14.

Control circuitry 26 may direct display 14 to operate in different operating modes. For example, control circuitry 26 can direct display 14 to operate in a normal operating mode when privacy is not a concern. In the normal operating mode, the images on display 14 may be visible to people seated next to the user of device 10 due to the relatively wide angle of view of display 14 in normal operation. In situations in which privacy is a concern, a user may supply input to control circuitry 26 to place display 14 in a privacy mode in which the angle of view of display 14 is restricted. In response, control circuitry 26 may make adjustments to display 14 (e.g., backlight adjustments and/or adjustments to angle-of-view restriction structures elsewhere in display 14) that reduce the angle of view of display 14. When the angle of view of display 14 is lowered, it will become difficult or impossible for viewers that are located at off-axis positions relative to display 14 to view images on display 14 (e.g., a viewer seated next to the user on an airplane will not be able to view images on display 14). At the same time, the user of device 10 who is seated in an on-axis position will be able to use display 14 to view images.

Changes in the operating mode of display 14 to implement angle-of-view restrictions (i.e., adjustments to display 14 to place display 14 in normal viewing mode or a reduced-angle-of-view privacy mode) may be made based on user input or may be made automatically by control circuitry 26. Control circuitry 26 may, for example, use information such as content sensitivity information to determine whether or not content that is being display on display 14 should be displayed in normal mode or privacy mode. If, for example, a user is viewing a movie, the movie may be displayed in normal mode. In the event that a private message such as an incoming text message is detected, display 14 may be placed in privacy mode, thereby ensuring that the content of the text message will not be inadvertently revealed to unauthorized parties. If desired, only a part of display 14 may be placed in privacy mode (e.g., to ensure the privacy of a text message) while the remainder of display 14 is operated normally (e.g. to display a movie).

Figure 3:
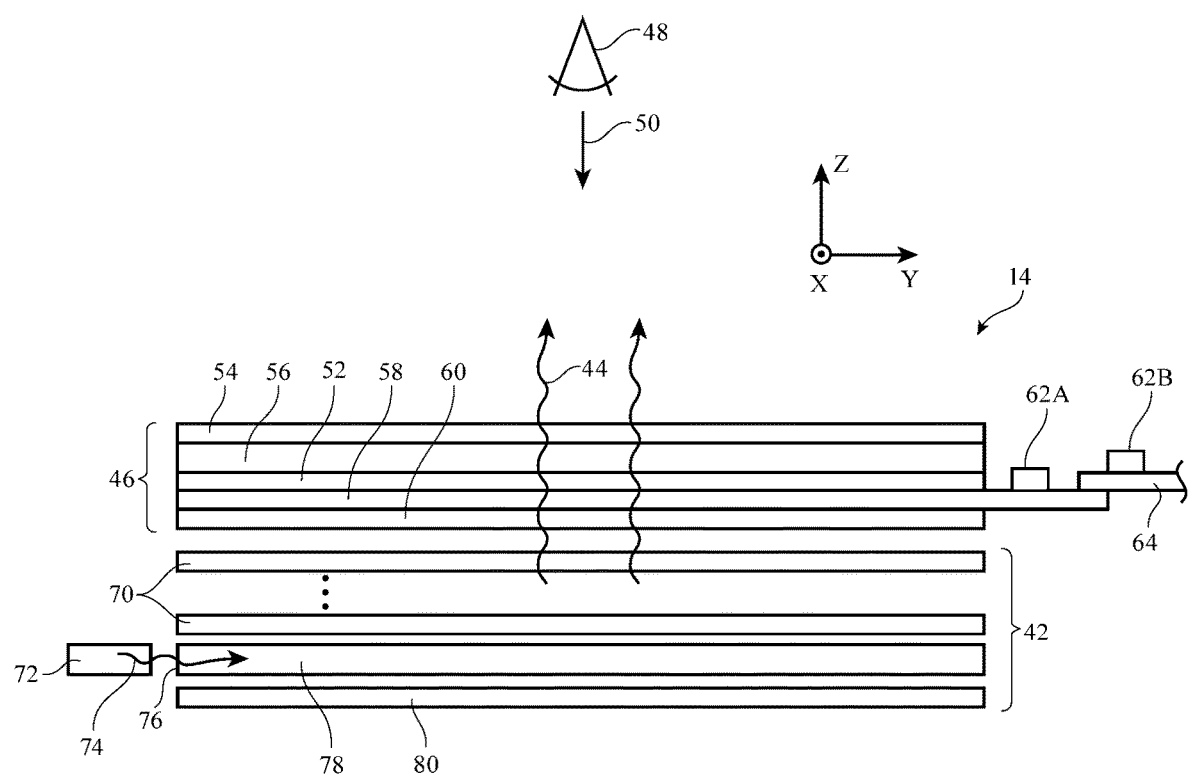
FIG. 3 is a cross-sectional side view of an illustrative display in accordance with an embodiment.

A cross-sectional side view of display 14 is shown in FIG. 3. Display 14 may have a rectangular shape (i.e., display 14 may have a rectangular footprint and a rectangular peripheral edge that runs around the rectangular footprint) or may have other suitable shapes. Display 14 may be planar, as shown in FIG. 3, or may have a curved profile.

As shown in FIG. 3, display 14 may include backlight structures such as backlight unit 42 for producing backlight illumination such as backlight 44. During operation, backlight 44 travels outwards (vertically upwards in dimension Z in the orientation of FIG. 3) and passes through an array of pixels in display layers 46. This illuminates any images that are being produced by the pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 58 and 56 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer in the upper or lower portion of display 14 may also be used.

During operation of display 14 in device 10, control circuitry (e.g., one or more integrated circuits on a printed circuit) may be used to generate information to be displayed on display 14 (e.g., display data). The information to be displayed may be conveyed to one or more display driver integrated circuits such as illustrative circuit 62A or illustrative circuit 62B using a signal path such as a signal path formed from conductive metal traces in a rigid or flexible printed circuit such as printed circuit 64 (as an example).

Backlight structures 42 may include a light guide layer such as light guide layer 78 (sometimes referred to as a light guide structure or light guide). Light guide layer 78 may be formed from one or more stacked layers of transparent material such as clear glass or plastic (e.g., molded plastic that forms a light guide plate, a thin flexible plastic film, etc.). During operation of backlight structures 42, light sources such as light source 72 may generate light that creates backlight 44. Light source 72 may be an array of light-emitting diodes that runs along one or more edges of light guide layer 78 such as edge 76 of light guide layer 78 (i.e., into the page along the X axis in the orientation of FIG. 3). Light-source 72 may emit light 74 into edge 76 of light guide layer 78.

Light 74 may be distributed throughout light guide layer 78 due to the principal of total internal reflection. Scattering features (protrusions, recesses, etc.) may be incorporated into light guide layer 78 (e.g., on the upper and/or lower surface of layer 78) to scatter light from layer 78. Light that is scattered upwards in direction Z from light guide layer 78 may serve as backlight 44 for display 14. Light that scatters downwards may be reflected back in the upwards direction by reflector 80. Reflector 80 may be formed from a reflective material such as a layer of plastic covered with a dielectric mirror thin-film coating. To enhance backlight performance for backlight structures 42, backlight structures 42 may include optical films 70. Optical films 70 may include diffuser layers for helping to homogenize backlight 44 and thereby reduce hotspots and light collimating films such as prism films (sometimes referred to as brightness enhancement films) and turning films for directing backlight 44 towards direction Z. Optical films 70 may overlap the other structures in backlight unit 42 such as light guide layer 78 and reflector 80. For example, if light guide layer 78 has a rectangular footprint in the X-Y plane of FIG. 3, optical films 70 and reflector 80 may have a matching rectangular footprint. If desired, films such as compensation films may be incorporated into other layers of display 14 (e.g., a reflective polarizer layer).

Layers 46 and/or backlight 42 may be provided with structures that allow display 14 to be operated in multiple viewing modes such as a normal angle-of-view mode and a reduced angle-of-view mode. When operated in the normal angle-of-view mode, viewer 48 can view images on display 14 over a relatively wide range of angles (see, e.g., display 14 of FIG. 4, which is displaying images over wide angle of view A). When privacy is desired, display 14 can be operated in the reduced angle-of-view mode. In this mode, viewer 48 can view images on display 14 over a more restricted range of angles (see, e.g., display 14 of FIG. 5, which is displaying images over reduced angle of view B, where B<A).

Figure 6:
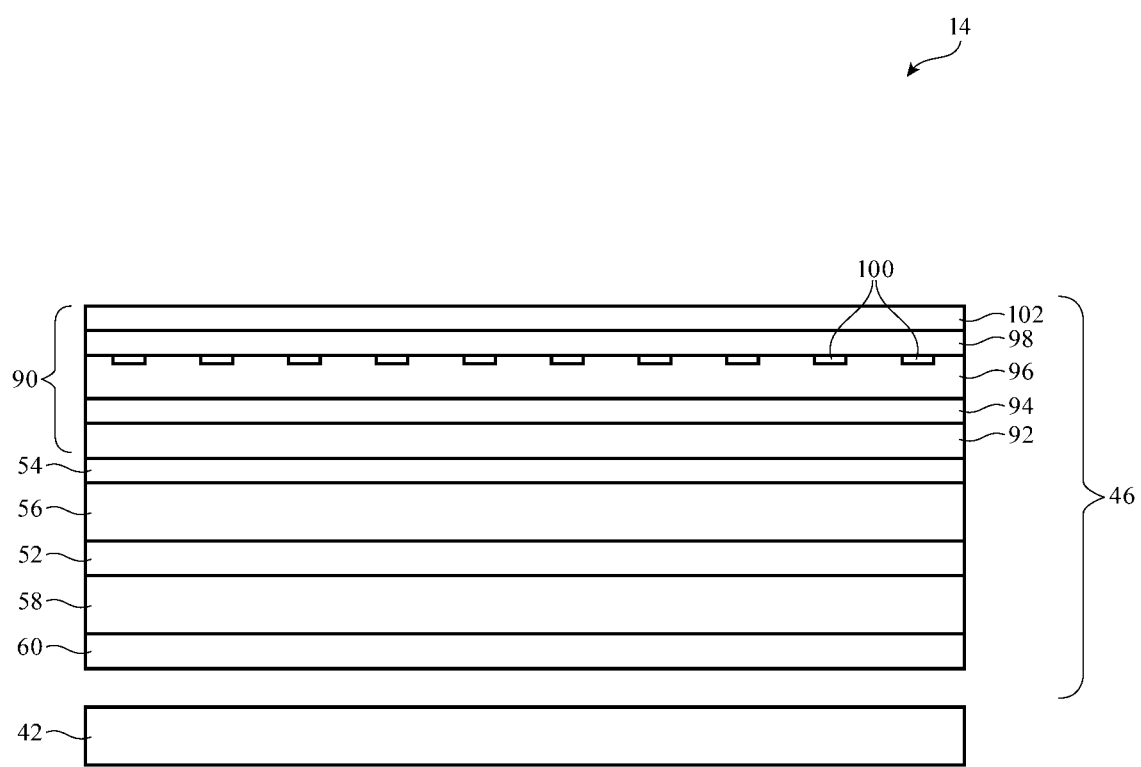
FIG. 6 is a cross-sectional side view of an illustrative display having a liquid crystal angle-of-view adjustment structure for placing the display in a wide angle or reduced-viewing-angle viewing mode in accordance with an embodiment.

FIG. 6 is a cross-sectional side view of display 14 showing illustrative angle-of-view adjustment structures that may be incorporated into display layers 46 to implement multiple viewing modes. In the example of FIG. 6, angle-of-view adjustment layers 90 have been incorporated into display 14 on top of upper polarizer 54. Illustrative display 14 of FIG. 6 is a liquid crystal display (i.e., the layers of display 14 under layers 90 form a liquid crystal display), but, in general, display 14 may be any suitable type of display (e.g., one or more layers of display 14 under layers 90 may form an electrophoretic display, an organic light-emitting diode display, or other display). Layers 90 serve as a liquid crystal filter that can be placed in a normal mode to allow display 14 to display images with a normal angle of view or that can be placed in an angle-of-view limiting mode in which portions of layers 90 are darkened or translucent so that display 14 displays images with a restricted angle of view.

As shown in FIG. 6, layers 90 may include lower substrate 92, lower electrode structures such as lower electrode 94, liquid crystal filter layer 96, upper electrode structures such as upper electrode(s) 100, upper substrate 98, and polarizer 102. Electrodes 94 and 100 may be formed from transparent conductive structures such as layers of indium tin oxide or metal that is sufficiently thin to be transparent to light. Electrode 94 may be a blanket conductive film and electrode 100 may be patterned, electrode 94 may be patterned and electrode 100 may be a blanket conductive film, or both electrodes 94 and 100 may be patterned. Configurations in which lower electrode 94 is a blanket film that covers display 14 and in which upper electrode 100 is patterned may sometimes be described herein as an example.

The patterned electrode of layers 90 (i.e., electrode 100 in the example of FIG. 6) may have elongated finger (e.g., elongated strips of electrode material that extend into the page in the orientation of FIG. 6), may have a grid shape, or may have other suitable shapes. Arrangements in which electrode 100 has multiple elongated parallel strips (fingers) that run along one of the dimensions of display 14 (e.g., vertically parallel to the left and right edges of display 14 of FIG. 1) may sometimes be described herein as an example.

Substrates 92 and 98 may be formed from transparent planar structures such as layers of clear glass, ceramic, sapphire or other transparent crystalline materials, clear plastic, etc. Electrode 94 may be deposited on the surface of substrate 92 that faces filter layer 96. Electrodes 100 may be formed on the surface of substrate 98 that faces filter layer 96.

Filter layer 96 may be formed from any suitable structure that can be electrically modulated by application of electric fields through electrodes 94 and 100 to exhibit changes in light transmittance through layers 90. As an example, filter layer 96 may be a layer of material that includes liquid crystals.

With one suitable arrangement, filter layer 96 is a liquid crystal layer (e.g., a liquid that is retained between layers 98 and 100). In this type of configuration, column spacers may be interposed between substrate layers 98 and 92 to help maintain a desired spacing between layers 98 and 92 (i.e., a desired thickness for the liquid crystal layer) and to prevent layers 98 and 92 from directly contacting each other.

Figure 4:
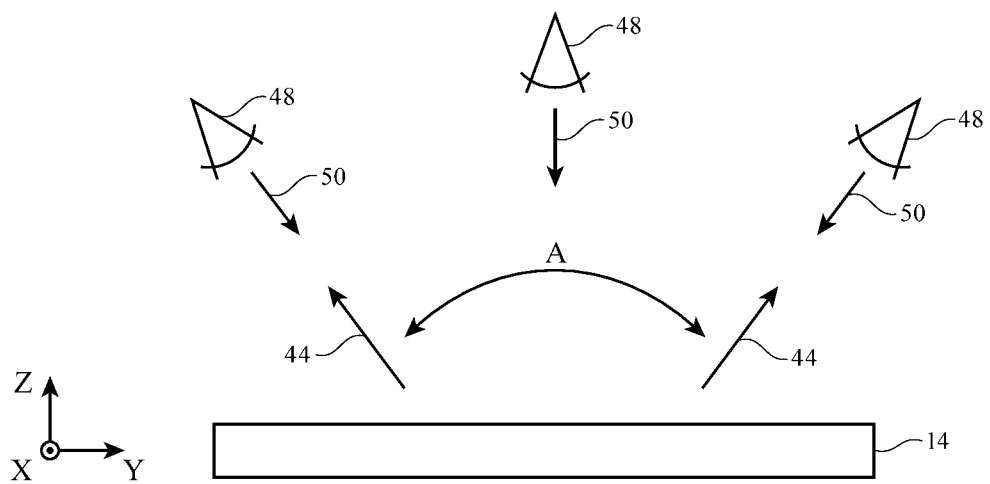
FIG. 4 is a cross-sectional side view of an illustrative display being used in a wide viewing angle mode in accordance with an embodiment.
Figure 5:
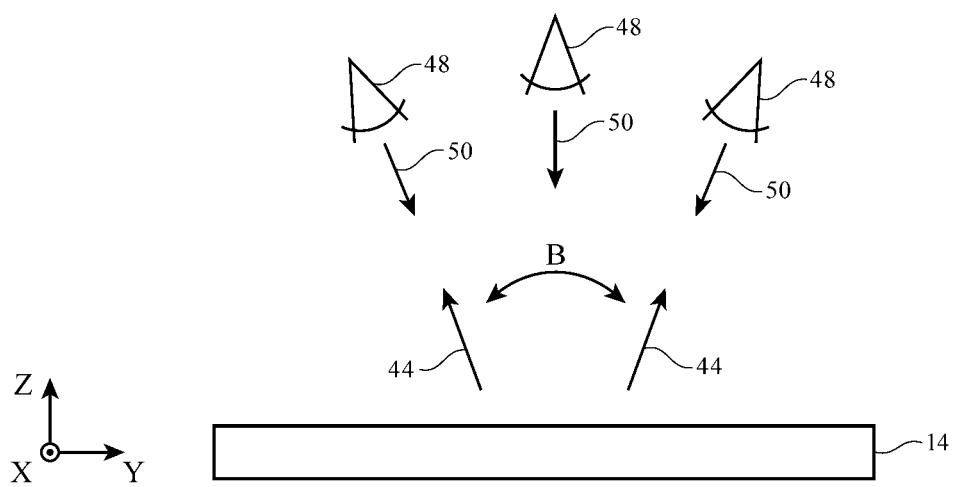
FIG. 5 is a cross-sectional side view of an illustrative display of the type shown in FIG. 4 being used in a reduced-viewing-angle mode in accordance with an embodiment.
Figure 7:
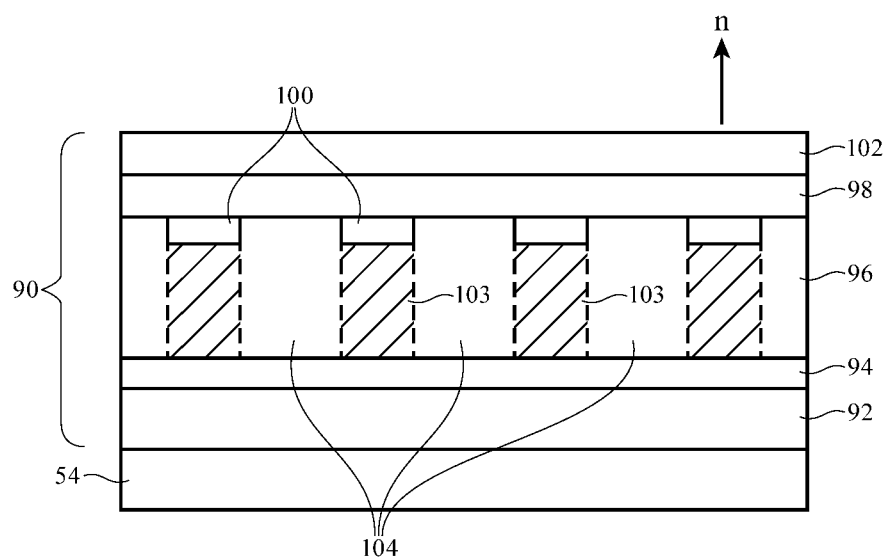
FIG. 7 is a cross-sectional side view of a portion of the liquid crystal viewing angle restriction device of FIG. 6 in accordance with an embodiment.

The operation of layer 90 in this type of arrangement is shown in FIG. 7. Due to the presence of polarizer layer 54, light that is exiting display 14 will be linearly polarized. Electrodes 100 can selectively apply electric fields to underlying portions 103 of layer 96, without applying electric fields to non-overlapped portions 104 of layer 96. Polarizer 102 is present on the top of layers 90 and works in conjunction with polarizer 54. When no electric field is applied to portions 103, portions 103 and portions 104 will not rotate the polarization of light travelling upwards through layer 96 and layers 90 will be transparent to light at all normal angles relative to surface normal n of display 14. This allows light 44 to exit display 14 over angle-of-view A (FIG. 4). When an electric field is applied to portions 103, portions 103 will rotate the polarization of light that is traveling upwards through layer 96 so that this light is selectively blocked by polarizer 102 (i.e., portions 103 will become opaque). Portions 104 will remain transparent. In this configuration, darkened regions 103 will serve as electrically controlled microlouvers that restrict the angle-of-view of exiting display light. Display 14 will therefore emit images over reduced angle-of-view B (FIG. 5).

With another suitable arrangement, filter layer 96 is a polymer dispersed liquid crystal layer. In a polymer dispersed liquid crystal, pockets of liquid crystal material are dispersed within voids in a cured polymer matrix. The polymer dispersed liquid crystal material of layer 96 can then be placed in either a low-haze transparent state or a high-haze translucent state by applying signals with electrodes 94 and 100.

The polymer matrix of the polymer dispersed liquid crystal layer has an index of refraction. When no electric field is applied to the liquid crystal regions with the electrodes, the liquid crystals are randomly aligned and scatter light due to index of refraction differences between the liquid crystal regions and the polymer matrix. In this situation, regions 103 of layer 96 will be translucent and will scatter light associated with larger angles with respect to surface normal n of display 14. The application of no electric field to regions 102 therefore causes regions 102 to act as light diffusing louvers that scatter off-axis light and thereby reduce the angle of view of display 14 (i.e., display 14 is placed in privacy mode, as shown by reduced angle-of-view B in FIG. 5). When electrodes 94 and 100 apply an electric field to regions 103, the liquid crystal material within the voids of the polymer in regions 103 will align, thereby causing the index of refraction of the liquid crystal pockets to match that of the surrounding polymer. In this situation, regions 103 will be transparent (i.e., regions 103 will be clear and will exhibit low haze). The angle of view of display 14 is accordingly large and display 14 can operate in a normal mode (see, e.g., display 14 will exhibit normal angle of view A of FIG. 4).

When filter layer 96 is formed from polymer dispersed liquid crystal, polarizer 102 can be omitted.

If desired, layer 96 may be formed from guest-host liquid crystal material (i.e., angle-of-view adjustment layers 90 may be based on a guest-host liquid crystal modulator). Polarizer 102 can be omitted when layers 90 form a guest-host liquid crystal device.

In a guest-host liquid crystal device, guest-host liquid crystal layer 96 may be interposed between substrate layers 92 and 98. During operation, control signals may be applied to electrodes 94 and 100 from control circuitry 26. The control signals may control the transmission of the portions of layers 90 that are overlapped by electrodes 100 (i.e., portions 103 of FIG. 7). For example, the transmission of portions 103 of layer 96 may be adjusted from a high level when an applied alternating current voltage or other applied voltage from electrodes 100 and 94 across layer 96 is small to a low level when the applied voltage across these portions of layer 96 is high.

Liquid crystal layer 96 may include liquid crystal molecules (liquid crystals), which may be referred to as host molecules, and dye molecules, which may be referred to as guest molecules. The guest molecules may be rotated when the liquid crystal molecules are rotated by applied electric fields. Any suitable guest-host system may be used for liquid crystal layer 96 of layers 90. With one suitable arrangement, which may sometimes be described herein as an example, layers 90 may contain a vertical alignment layer (e.g., a polyimide rubbing layer) on the surfaces of layers 90 that are adjacent to layer 96 to orient liquid crystal molecules in layer 96 vertically in the absence of applied electric field to electrodes 100 and 94. The dye molecules in layer 96 may be associated with a dichroic dye having a concentration of about 1-2%, more than 0.5%, or less than 4%. When the applied voltage to layer 96 is low (e.g., 0 volts), all of layer 96 may be transparent and the angle of view of display 14 may be high. When the applied voltage to layer 96 between electrodes 100 and electrode 94 is high, regions 103 will become opaque and layers 90 will restrict the angle of view of display 14. If desired, configurations in which the alignment layers are used to align the molecules of layer 96 in different orientations may also be used (e.g., to create a guest-host system in which regions 103 are transparent at high voltages and opaque at low voltages).

Figure 8:
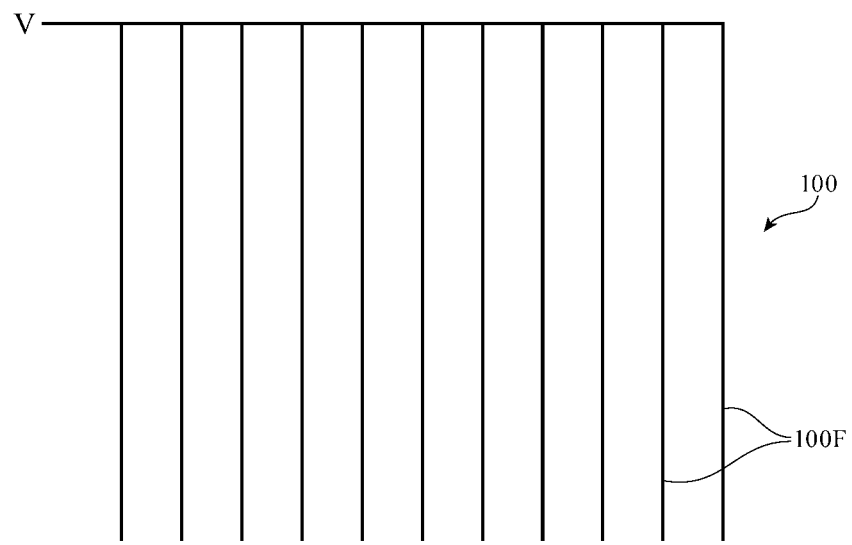
FIGS. 8 and 9 are top views of illustrative electrode patterns that may be used for the liquid crystal viewing angle restriction device of FIGS. 6 and 7 in accordance with an embodiment.
Figure 9:
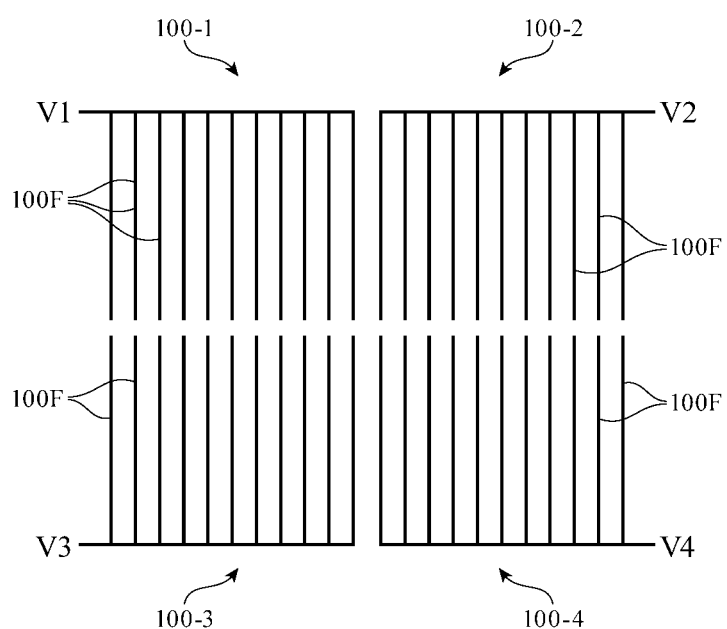

Some or all of display 14 may be covered with angle-of-view adjustment structures and the angle-of-view adjustment structures may all be controlled together or may have individually controlled portions. With one illustrative configuration, the entire surface of display 14 may be covered with an angle-of-view adjustment layer using an electrode pattern of the type shown by illustrative electrode pattern 100 of FIG. 8. With this arrangement, all of the fingers 100F in electrode 100 may be controlled together using a single applied voltage V. If desired, different portions of display 14 may be covered with individually controlled sets of fingers 100F. As shown in FIG. 9, for example, display 14 may be provided with angle-of-view adjustment structures that include first electrode 100-1, which is controlled by voltage V1, second electrode 100-2 that is controlled by voltage V2, third electrode 100-3 that is controlled by voltage V3, and fourth electrode 100-4 that is controlled by voltage V4. Any suitable level of granularity may be used in forming electrode structures for angle-of-view adjustment structures 90. For example, display 14 may be divided into 2-20, more than 2, more than 4, more than 10, or less than 100 individually controllable regions each of which can have a normal or restricted angle-of-view depending on the control signals supplied to the electrodes in those regions by control circuitry 26. The use of four individually controlled sets of electrode fingers 100F in the example of FIG. 9 is merely illustrative.

Using an arrangement of the type shown in FIG. 9, selected regions of display 14 can be placed in privacy mode (e.g., to hide text messages, sensitive documents, or other sensitive content in those regions) at the same time that the remainder of display 14 is being operated in normal angle-of-view mode.

If desired, backlight structures 42 may be used to place display 14 in different angle-of-view modes. For example, backlight structures 42 may be used in conjunction with layers 90 or may be used separately to place all or selected parts of display 14 in a normal angle-of-view mode or a restricted angle-of-view mode. Backlight structures 42 may have an array of electrically adjustable lenses that allow selected portions of display 14 to be placed in different angle-of-view modes using backlight structures 42 or that may be adjusted in unison when the angle of view of all of display 14 is being adjusted.

The lenses of backlight structures 42 may be controlled differently in different regions (e.g., left and right halves, quadrants, etc.). As described in connection with the electrode segmenting scheme of FIG. 9, this allows control circuitry 26 to selectively place particular region(s) of display 14 in a restricted angle-of-view mode while other portions of display 14 present a viewer with content having a normal angle-of-view. Configurations for backlight structures 42 in which all of the adjustable lenses are adjusted in tandem may also be used.

Figure 10:
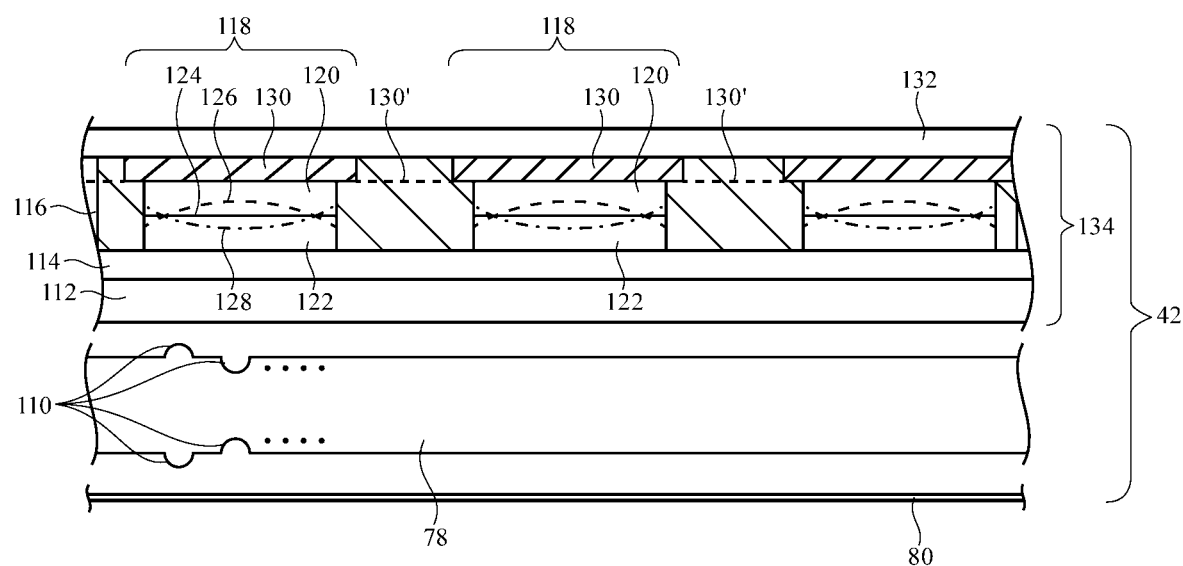
FIG. 10 is a cross-sectional side view of an illustrative backlight having an array of adjustable optical elements such as an array of liquid lenses for adjusting backlight illumination properties in accordance with an embodiment.

An illustrative adjustable backlight unit is shown in FIG. 10. As shown in FIG. 10, backlight structures 42 may include a light guide layer such as light guide layer 78. Light guide layer 78 may receive light 74 from light sources such as light source 72 of FIG. 3. Light scattering features 110 such as protrusions and/or recesses in the upper and/or lower surfaces of light guide layer 78 may help scatter backlight upwards through the layers of adjustable lens array 134. Reflector 80 may help to recycle light that is scattered downwards.

The illustrative lens array of FIG. 10 contains an array of liquid lenses 118. Liquid lenses 118 may be formed from multiple layers of liquid materials such as liquid layer 122 and liquid layer 120. Layers 120 and 122 may be laterally separated by support structures 116 (e.g., a patterned polymer layer with openings for respective lenses 118). Support structures 116 and the liquid layers of lenses 118 may be sandwiched between upper substrate layer 132 and lower substrate layer 112. Layers 112 and 132 may be formed from transparent glass, clear plastic, or other transparent substrate material.

Lens array 134 may have electrodes such as transparent electrodes 114 and 130 on substrates 112 and 132. Electrodes 114 and 130 may be formed from transparent conductive material such as indium tin oxide, metal that is sufficiently thin to be transparent, or other conductive transparent material. Electrode 114 may be a blanket conductive film and electrode 130 may be patterned to address individual lenses 118 or groups of lenses 118, electrode 130 may be a blanket film and electrode 114 may be patterned to form individually controllable electrode structures for corresponding lenses 118 or groups of lenses 118, or both electrodes 114 and 130 may be patterned to address lenses individually or in groups. As shown by dashed lines 130', all of lenses 118 may, if desired, be addressed at the same time (i.e., lower electrode 114 may be a blanket film that covers display 14 and upper electrode 30 may be a blanket film that covers display 14).

Using the electrodes of lens array 134, the optical properties of liquid lenses 118 may be adjusted for all of backlight unit 42 or for one or more selected portions of backlight unit 42. The layers of lenses 118 (i.e., layers 120 and 122) are immiscible. For example, layer 122 may be water and layer 120 may be oil. In the absence of applied electrical signals with electrodes 130 and 114, layers 120 and 122 may be separated by a planar interface such as planar interface 124. When it is desired to change the optical properties of lenses 118, electric fields may be applied, thereby forming convex lenses or concave lenses, as illustrated by illustrative curved interfaces 126 and 128 of FIG. 10. By changing the curvature of the interface between layers 120 and 122 and thereby adjusting the focal lengths of lenses 118, backlight 114 from light guide layer 78 may be collimated (to create a privacy mode) or spread out (to support normal angle-of-view operation).

The way in which lenses 118 are adjusted may depend on the configuration of light guide layer 78 and the desired operating mode of display 14.

Figure 11:
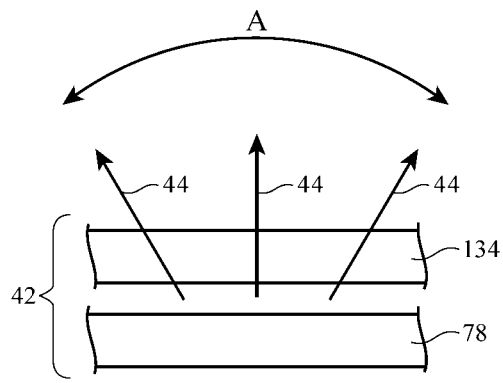
FIGS. 11, 12, 13, and 14 show how an array of adjustable optical elements may be used in adjusting backlight structures to produce diffuse or collimated backlight illumination in accordance with embodiments.
Figure 12:
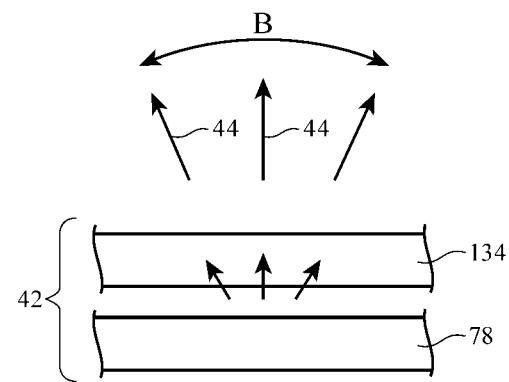

In the examples of FIGS. 11 and 12, light scattering features 110 on light guide layer 78 have been configured to produce diffuse backlight illumination 44. In the configuration of FIG. 11, lenses 118 of lens array 134 have been configured to allow the diffuse backlight to spread out through display 14 with a normal angle-of-view A (e.g., by placing lenses 118 in a state in which the interface between layers 120 and 122 is flat as shown by interface 124 of FIG. 1). In the configuration of FIG. 11, lenses 118 of lens array 134 have been configured to collimate light 44 so that display 14 has a restricted angle-of-view B (e.g., by placing lenses 118 in a state in which the interface between layers 120 and 122 produces convex lenses or other lenses that collimate backlight 44).

Figure 13:
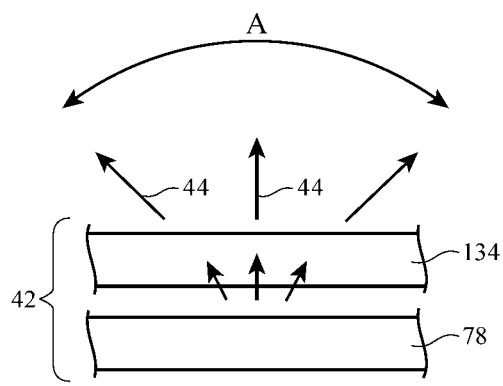
Figure 14:
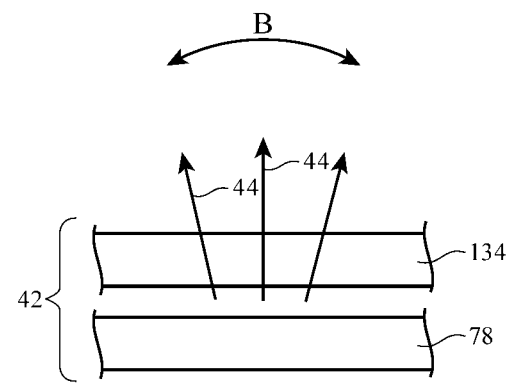

In the examples of FIGS. 13 and 14, light scattering features 110 on light guide layer 78 have been configured to supply lens array 134 with collimated light. In the configuration of FIG. 13, lenses 118 of lens array 134 have been configured to diffuse and thereby spread out the collimated light to form diffuse backlight illumination 44 (e.g., lenses 118 may be placed in a defocusing state in which lenses 118 are configured as concave lenses). This allows display 14 to exhibit a normal angle-of-view A. In the configuration of FIG. 14, lenses 118 of lens array 134 have been configured with planar interfaces (see planar interface 124) or other interface shapes that allow the collimated light from light guide layer 78 to exit display 44 as backlight illumination 44 with narrow angle-of-view B.

Figure 15:
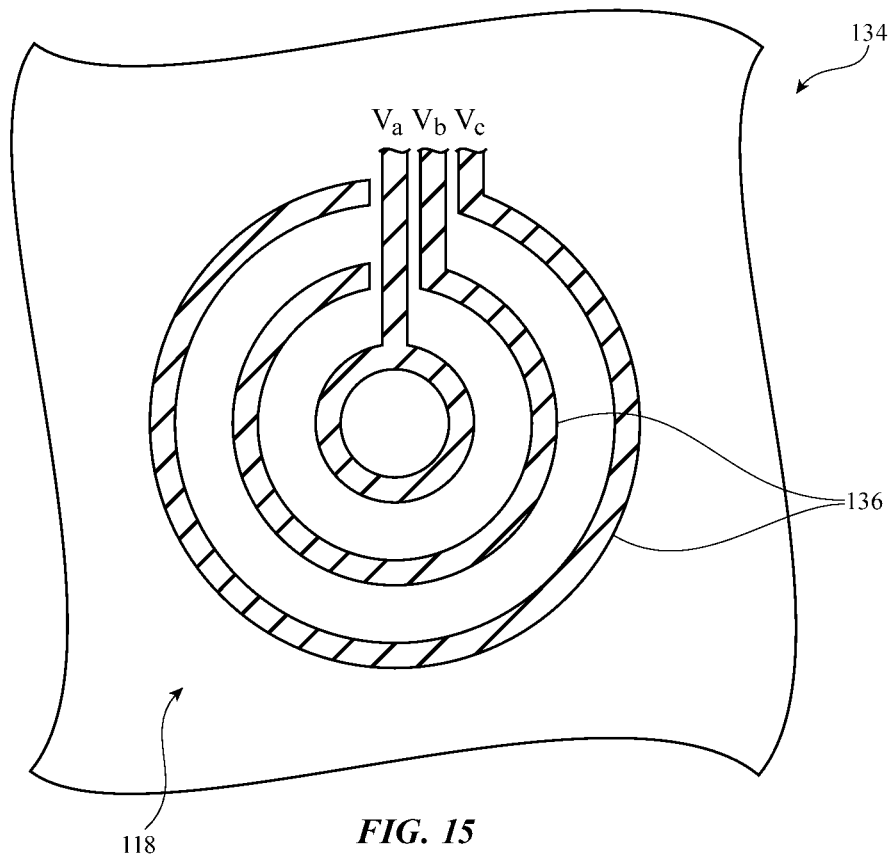
FIG. 15 is a top view of an adjustable liquid crystal lens having concentric electrodes for forming an adjustable lens in accordance with an embodiment.

If desired, electrically controllable lenses may be formed by using electrodes such as ring-shaped electrodes 136 of FIG. 15 to form circular lenses (or by using electrodes with other shapes to form cylindrical lenses or other suitable lenses). Electrodes 136 may apply signals that electrically modify the index of refraction of underlying liquid crystal material. In the example of FIG. 15, each set of ring-shaped electrodes forms a respective electrically adjustable lens 118 in lens array 134. By varying the voltages on electrodes 136 (e.g., voltages Va, Vb, and Vc in the illustrative three-ring configuration of FIG. 15), the optical properties of each lens 118 may be adjusted. Lenses 118 may be adjusted in tandem for part or all of backlight unit 42.

As shown in the cross-sectional side view of lens array 134 of FIG. 116, each lens 118 may be formed from a layer of liquid crystal material 142 that is sandwiched between upper and lower transparent substrate layers such as substrates 138 and 144. Lower electrode 140 may be formed on substrate 138. Upper electrode(s) 136 may be formed on substrate 144. Liquid crystal layer 142 may be interposed between layers 138 and 144. Other configurations may be used for the electrodes of lens array 134 if desired. The configuration of FIGS. 15 and 16 is merely illustrative.

Figure 16:
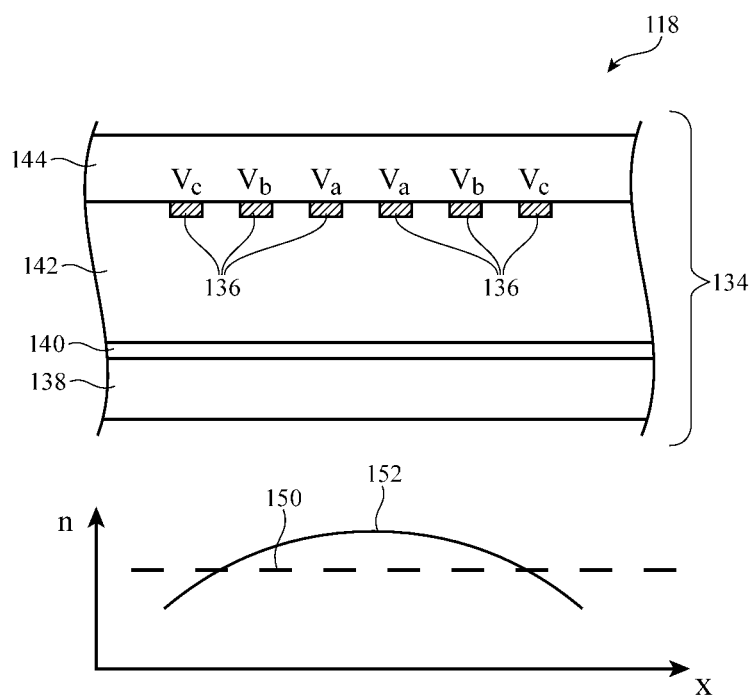
FIG. 16 is a cross-sectional side view of the illustrative adjustable optical element of FIG. 15 and an associated graph in which liquid crystal layer index-of-refraction values have been plotted as a function of distance across the element in accordance with an embodiment.

Light guide layer 78 may supply lens array 134 of FIG. 16 with backlight that passes through lens array 134 and the other layers of display 14. During operation of device 10, the voltages applied to the electrodes of lenses 118 may be adjusted by control circuitry 26 to locally change the index-of-refraction of liquid crystal layer 142 under each of the electrodes. This adjusts the optical properties of lens 118 and adjusts the angles of light rays 44 exiting backlight structures 42.

In the graph of the illustrative arrangement of FIG. 16, the index of refraction n for liquid crystal layer 142 has been plotted as a function of distance X across lens 118 for two different electrode voltage scenarios. In the first scenario, voltages Va, Vb, and Vc are all zero, so the index n is constant across lens 118, as shown by dashed line 150. In this situation, layer lens 118 effectively has an infinite focal length (i.e., lens 118 does not focus light). In the second scenario, voltage Va, Vb, and Vc have increasing magnitudes, so n varies as show by line 152. In this situation, lens 118 has a convex shape and focuses light passing through lens array 134. Lens array 134 of FIGS. 15 and 16 can therefore be operated in a first mode in which light passes through array 134 without being significantly changed (see, e.g., light 44 of FIG. 11, which provides display 14 with normal angle-of-view A) and in a second mode in which light that passes through array 134 is collimated to reduce the angle of view of display 14 (see, e.g., light 44 of FIG. 12, which is focused to restricted angle-of-view B due to the focusing properties of lens array 134). Other arrangements for backlight 42 (e.g., configurations in which electrically controllable liquid crystal lens structures form concave lenses, configurations in which lens array 134 has an array of cylindrical lenses rather than a two-dimensional array of circular lenses, configurations in which lens array 134 has electrically controllable lenses formed using other electrically adjustable optical structures, etc.) may also be used.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   display layers for a display that include an array of pixels with an angle of view for displaying images, wherein the angle of view has a width with respect to a surface normal of the display; and
   backlight structures for the display that provide backlight illumination that passes through the display layers, wherein the backlight structures include an electrically adjustable lens array that adjusts the backlight illumination and thereby adjusts the width of the angle of view for the display, wherein the electrically adjustable lens array includes liquid lenses each of which has immiscible first and second liquid layers, wherein the electrically adjustable lens array comprises transparent electrodes that apply signals to the liquid lenses, and wherein the liquid lenses are configured to change between a concave shape and a convex shape based on the signals applied by the transparent electrodes.

2. The apparatus defined in claim 1 further comprising control circuitry that operates the backlight structures in:
   a first mode in which the liquid lenses of the lens array have a first configuration in which the backlight illumination provides the display with a first angle of view with respect to a surface normal of the display; and
   a second mode in which the liquid lenses of the lens array have a second configuration in which the backlight illumination provides the display with a second angle of view that is different than the first angle of view.

3. The apparatus defined in claim 2 wherein the display layers include a liquid crystal layer.

4. The apparatus defined in claim 1 wherein the electrically adjustable lens array comprises transparent electrodes that apply signals to the liquid lenses.

5. The apparatus defined in claim 4 wherein the transparent electrodes are patterned to form individually addressable regions each including a different respective set of the liquid lenses.

6. Apparatus, comprising:
   display layers for a display that include an array of pixels with an angle of view for displaying images, wherein the display layers include:
       first, second, and third polarizers;
       a first liquid crystal layer between the first and second polarizers that forms the array of pixels; and
       a second liquid crystal layer between the second and third polarizers;
   backlight structures for the display that provide backlight illumination that passes through the display layers, wherein the backlight structures include an electrically adjustable lens array that adjusts the backlight illumination; and
   electrode fingers that apply electric fields to the second liquid crystal layer and thereby adjust the angle of view for the display, wherein each of the electrode fingers completely extends across at least two pixels of the array of pixels.

7. Apparatus, comprising:
   display layers for a display that include an array of pixels for displaying images, wherein the display layers include:
       first and second polarizers;
       a liquid crystal layer between the first and second polarizers that forms the array of pixels; and
       a polymer dispersed liquid crystal layer;
   backlight structures for the display that provide backlight illumination that passes through the display layers, wherein the backlight structures include an electrically adjustable lens array that adjusts the backlight illumination and thereby adjusts an angle of view for a first region of the display to be different from an angle of view for a second region of the display; and electrode fingers that apply electric fields to the polymer dispersed liquid crystal layer, wherein the electrode fingers extend across at least two pixels of the array of pixels.

8. The apparatus defined in claim 7 wherein the electrically adjustable lens array includes electrically adjustable liquid crystal lenses each of which includes liquid crystal material and lens electrodes.

9. The apparatus defined in claim 8 wherein the lens electrodes apply signals to the liquid crystal lenses to adjust the liquid crystal material.

10. The apparatus defined in claim 9 wherein the lens electrodes are patterned to form individually addressable regions each having a different respective set of the liquid crystal lenses.

11. The apparatus defined in claim 7 wherein the electrode fingers extend across at least a quarter of the display.

12. The apparatus defined in claim 11 wherein the electrode fingers extend across at least half of the display.

13. The apparatus defined in claim 12 wherein the electrode fingers extend across the entire display.

14. The apparatus defined in claim 1 wherein the electrically adjustable lens array includes first and second electrodes, wherein the first electrode contacts the first liquid layer, and wherein the second electrode contacts the second liquid layer.

15. The apparatus defined in claim 14 wherein the first and second electrodes are formed from transparent conductive material.

16. The apparatus defined in claim 2 wherein the first mode collimates the backlight illumination and wherein the second mode spreads out the backlight illumination.

17. The apparatus defined in claim 6 wherein the electrically adjustable lens array includes electrically adjustable liquid crystal lenses each of which includes liquid crystal material.

18. The apparatus defined in claim 17 wherein the electrode fingers apply signals to the second liquid crystal layer so that portions of the second liquid crystal layer become dark and adjust a width of the angle of view with respect to a surface normal of the display.

19. The apparatus defined in claim 18 wherein the electrode fingers are patterned to form individually addressable regions each having a different respective set of the liquid crystal lenses.

20. The apparatus defined in claim 6 wherein the electrode fingers extend across the entire display.

* * * * *